United States Patent
Aihara

(10) Patent No.: US 8,679,263 B2
(45) Date of Patent: Mar. 25, 2014

(54) SOLDER BONDING STRUCTURE AND SOLDERING FLUX

(75) Inventor: Masami Aihara, Kakogawa (JP)

(73) Assignee: Harima Chemicals, Inc., Hyogo (JP)

( * ) Notice: Subject to any disclaimer, the term of this patent is extended or adjusted under 35 U.S.C. 154(b) by 515 days.

(21) Appl. No.: 12/918,169

(22) PCT Filed: Feb. 19, 2009

(86) PCT No.: PCT/JP2009/052925
§ 371 (c)(1),
(2), (4) Date: Nov. 3, 2010

(87) PCT Pub. No.: WO2009/104693
PCT Pub. Date: Aug. 27, 2009

(65) Prior Publication Data
US 2011/0036628 A1 Feb. 17, 2011

(30) Foreign Application Priority Data
Feb. 22, 2008 (JP) .................. 2008-042089

(51) Int. Cl.
*B23K 35/34* (2006.01)
(52) U.S. Cl.
USPC ............................. 148/23; 228/101
(58) Field of Classification Search
USPC .......................... 148/23; 228/101
See application file for complete search history.

(56) References Cited

U.S. PATENT DOCUMENTS

| 2002/0195170 A1* | 12/2002 | Nomura et al. | 148/23 |
| 2007/0221711 A1 | 9/2007 | Wada et al. | |
| 2008/0053572 A1 | 3/2008 | Sanji et al. | |

FOREIGN PATENT DOCUMENTS

| EP | 1 995 016 A1 | 11/2008 |
| JP | 05-228689 A | 9/1993 |
| JP | 09-122975 A | 5/1997 |
| JP | 09-186442 A | 7/1997 |
| JP | 09-234588 A | 9/1997 |
| JP | 10-077380 A | 3/1998 |
| JP | 2001-150184 A | 6/2001 |
| JP | 2002-336992 A | 11/2002 |
| JP | 2008/030103 | 2/2008 |

(Continued)

OTHER PUBLICATIONS

Chinese Office Action issued in Application No. 200980104436.2 dated Jun. 29, 2012.
International Search report PCT/JP2009/052925, dated May 26, 2009.

(Continued)

*Primary Examiner* — Weiping Zhu
(74) *Attorney, Agent, or Firm* — Sughrue Mion, PLLC

(57) ABSTRACT

Disclosed is a solder bonding structure which is capable of retaining sufficient solder bonding strength and ensuring high bonding reliability even in severe environments having an extremely large temperature difference. In the solder bonding structure, an electronic component 4 is mounted on a main surface 1a of a substrate having an electrode section 2 and an insulating film 3, and the electrode section 2 and the electronic component 4 are electrically bonded to each other through a solder section 5, and a flux residue 6 exuded from the solder section 5 is present between the electronic component 4 and the insulating film 3. The flux contains an acrylic resin, an activating agent, and a thixotropic agent having a hydroxyl group. The glass transition point of the acrylic resin is not higher than −40° C., or not lower than the softening temperature of the flux residue. The flux residue has a maximum value of $300 \times 10^{-6}$/K or less of linear thermal expansion coefficient within a temperature range from −40° C. to the softening temperature of the flux residue.

10 Claims, 1 Drawing Sheet

(56) References Cited

FOREIGN PATENT DOCUMENTS

| | | |
|---|---|---|
| JP | 2008-062252 A | 3/2008 |
| TW | 200808485 A | 2/2008 |
| WO | 2006/041068 A1 | 4/2006 |

OTHER PUBLICATIONS

Taiwanese Office Action issued in TW Application No. 098105400, dated Jul. 17, 2013.

* cited by examiner

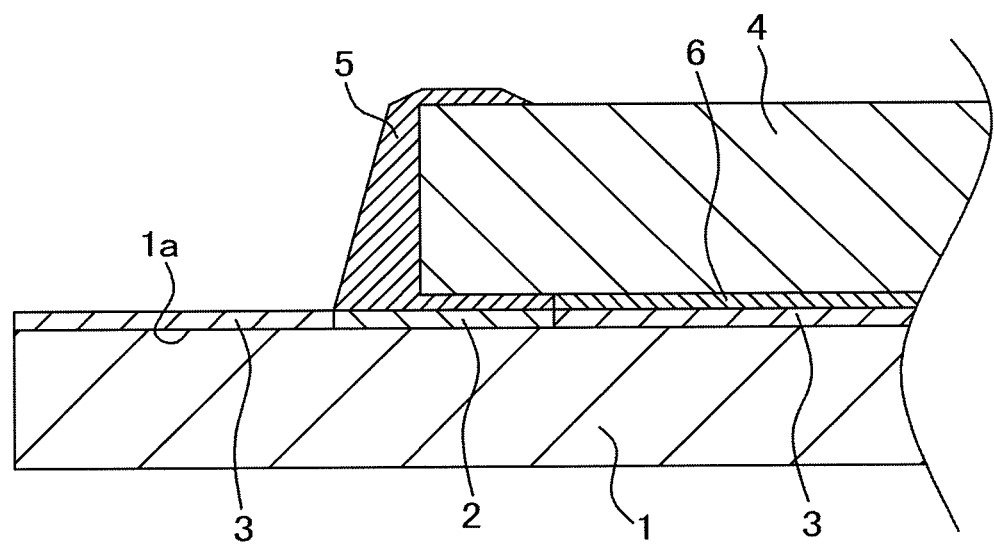

SOLDER BONDING STRUCTURE AND SOLDERING FLUX

CROSS REFERENCE TO RELATED APPLICATIONS

This application is a National Stage of International Application No. PCT/JP2009/052925 filed Feb. 19, 2009, claiming priority based on Japanese Patent Application No. 2008-042089, filed Feb. 22, 2008, the contents of all of which are incorporated herein by reference in their entirety.

TECHNICAL FIELD

The present invention relates to a solder bonding structure useful for solder-bonding electronic components or the like on a circuit substrate used in environments having, for example, a large temperature difference, and also relates to a soldering flux, and the like.

BACKGROUND ART

Heretofore, in case of mounting an electronic component onto a circuit substrate, a soldering method in which a solder paste composition containing a solder alloy powder and a flux is printed on the substrate, and the electronic component is mounted thereon and then heat-bonded thereto has generally been used. The flux acts to remove a metal oxide on the solder and the substrate surface, and prevent reoxidation of metal during soldering, and lower the surface tension of the solder. The flux is therefore indispensable for satisfactory soldering. However, when the electronic component is soldered to the circuit substrate by using the flux, a part or most part of the flux may remain on the substrate after soldering. This is generally called a "flux residue." For example, when an electronic component is mounted on the main surface of a substrate including an electrode section and an insulating film, and the electrode section and the electronic component are solder-bonded to each other, the flux ingredients exude from a solder section for bonding the electrode section and the electronic component, and the flux residue is present between the electronic component and the insulating film.

However, the above flux residue is liable to generating crack. Therefore, in the solder bonding structure in which the flux residue is present on the substrate or between the electronic component and the insulating film after soldering, there has arisen the problem that moisture enters from the cracked portions and causes short circuit defects between component leads, thereby impairing solder bonding reliability.

As a method of preventing the flux residue cracking, the following techniques have heretofore been proposed. That is, a) the technique in which a plasticizer having a high boiling point is added and the plasticizer is allowed to remain in the residue after soldering, as in the method of adding the ester of trimetric acid as a high boiling plasticizer into a solder paste whose base resin is rosin (refer to patent document 1); b) the technique using a synthetic resin designed to have flexibility as a base resin, such as a soldering flux using ethylene-acryl copolymer (refer to patent document 2), or a soldering flux using an acrylic resin whose glass transition temperature falls within the range of −50 to −35° C. (refer to patent document 3), as well as the flux using the polymer of ethylene or propylene; c) the technique in which the flux residue is removed by carrying out cleaning after soldering.

Patent document 1: Japanese Unexamined Patent Publication No. 9-234588
Patent document 2: Japanese Unexamined Patent Publication No. 9-122975
Patent document 3: Japanese Unexamined Patent Publication No. 2001-150184

DISCLOSURE OF THE INVENTION

Problems to be Solved by the Invention

However, the environments in which mounted substrates are used have recently been diversified. The mounted substrates are increasingly used in more severe environments subjected to an extremely large temperature difference and strong vibration, as in the case of in-vehicle substrates disposed in the vicinity of the engine within the engine room. In some cases, sufficient bonding reliability cannot be ensured even by a mounted substrate soldered by a conventional method employing means for preventing cracking of the flux residue. The problem of deterioration in bonding reliability occurs remarkably, in particular, in a mounted substrate in which an electronic component is mounted on the main surface of the substrate including an electrode section and an insulating film, and the electrode section and the electronic component are solder-bonded, and the flux residue is present between the electronic component and the insulating film. This problem is considered as follows. That is, apart from the cracking of the flux residue, there arises another problem that in the severe environments having the extremely large temperature difference, crack propagation occurs in the metal of the formed solder section, and hence the bonding strength is remarkably deteriorated, thus causing the deterioration in the bonding reliability. It is estimated that the mounted substrates disposed in the severe environments where there is an extremely large temperature difference as well as vibration being also loaded are on the increase. Consequently, in the current situation, development of a solder bonding structure capable of retaining sufficient bonding strength and exhibiting excellent bonding reliability even in the severe environments is demanded.

An object of this invention is to provide a solder bonding structure capable of retaining sufficient solder bonding strength and ensuring high bonding reliability even in severe environments subjected to an extremely large temperature difference, and also to provide a soldering flux for achieving the above mentioned solder bonding structure.

Means for Solving the Problems

The present inventor conducted tremendous research efforts to solve the above problem. As a result, the following facts are found, and the present invention is completed. That is, in order to suppress not only the flux residue but also the cracking occurred in the metal of the solder section, and retain solder bonding strength under severe load conditions where a cold-heat cycle is repeated between a temperature not lower than 90° C. and not higher than −30° C., it is important to set so that the maximum value of linear thermal expansion coefficient within a predetermined temperature range of the flux residue in post-reflow, and the glass transition point (glass transition temperature) of an acrylic resin as a flux ingredient fall within their respective specific ranges; and that a thixotropic agent having a hydroxyl group becomes essential as a flux ingredient.

That is, according to the solder bonding structure of the present invention, an electronic component is mounted on a main surface of a substrate including an electrode section and an insulating film, and the electrode section and the electronic component are electrically bonded to each other through a solder section, and a flux residue exuded from the solder section is present between the electronic component and the insulating film. The flux contains an acrylic resin, an activating agent, and a thixotropic agent having a hydroxyl group. The glass transition point of the acrylic resin is not higher than −40° C., or not lower than the softening temperature of the flux residue. The flux residue has a maximum value of $300 \times 10^{-6}$/K or less in linear thermal expansion coefficient within a temperature range from −40° C. to the softening temperature of the flux residue.

The soldering flux of the present invention is used for soldering by mixing it with a solder alloy powder, followed by reflowing. The soldering flux contains an acrylic resin, an activating agent, and a thixotropic agent having a hydroxyl group. The glass transition point of the acrylic resin is not higher than −40° C., or not lower than the softening temperature of a post reflow flux residue. The flux residue in post-reflow has a maximum value of $300 \times 10^{-6}$/K or less in linear thermal expansion coefficient within a temperature range from −40° C. to the softening temperature of the flux residue.

The solder paste composition of the present invention contains a solder alloy powder and the soldering flux of the present invention.

The method of preventing deterioration of solder bonding strength according to the present invention is a method of preventing deterioration of the bonding strength of a solder section under temperature load conditions where a cold-heat cycle is repeated between a temperature not lower than 90° C. and a temperature not higher than −30° C. The solder section is formed by using a solder alloy powder and the soldering flux of the present invention.

Effect of the Invention

According to the present invention, sufficient solder bonding strength is retained, and high bonding reliability is ensured, even in the severe environment having the extremely large temperature difference. Specifically, the present invention is capable of preventing deterioration in solder bonding strength even under temperature-load condition where the cold-heat cycle is repeated between a temperature 90° C. or more and −30° C. or less.

BRIEF DESCRIPTION OF THE DRAWINGS

FIG. 1 is an enlarged sectional view partially showing an embodiment of a solder structure of the present invention.

PREFERRED EMBODIMENTS FOR CARRYING OUT THE INVENTION

Firstly, an embodiment of the soldering flux and an embodiment of the solder paste composition of the present invention are described in detail.

The soldering flux of the present invention is used for soldering by mixing it with a solder alloy powder, followed by reflowing. More specifically, the flux of the present invention is mixed with the solder alloy powder and then reflowed, thereby forming solder. In this case, the flux of the present invention becomes a flux residue. In the present invention, it is essential that the maximum value of linear thermal expansion coefficient of a flux residue in post-reflow within the temperature range from −40° C. to the softening temperature of the flux residue (hereinafter referred to as "maximum linear thermal expansion coefficient") is $300 \times 10^{-6}$/K or less. The maximum linear thermal expansion coefficient is preferably $200 \times 10^{-6}$/K or less. Therefore, deterioration in bonding strength is prevented even if a severe cold-heat cycle is loaded, thereby ensuring high bonding reliability when used in the environment having the large temperature difference. In the present invention, the softening temperature of the flux residue in post-reflow may be a softening temperature obtained by measuring a solidified product (residue) generated when only the flux is heated at a predetermined temperature to remove the solvent and the like, or a softening temperature obtained by measuring a solidified product (residue) generated around solder when the flux is brought into a mixed state with a solder alloy powder (namely, in the state of a solder paste composition of the present invention as described later), and this is heated at a predetermined temperature to melt the solder and remove the solvent and the like. Here, the maximum linear thermal expansion coefficient can be obtained by, for example, the method described in a later-described example.

The flux of the present invention contains an acrylic resin as an essential ingredient. Preferred examples of the acrylic resin include those obtained by polymerizing at least one kind of polymerizable unsaturated group-containing monomer selected from the group consisting of acrylic acid, methacrylic acid, various esters of acrylic acid, various esters of methacrylic acid, crotonic acid, itaconic acid, maleic acid, maleic anhydride, esters of maleic acid, esters of maleic anhydride, acrylonitrile, methacrylonitrile, acrylamide, methacrylamide, vinyl chloride, and vinyl acetate. The polymerization of these polymerizable unsaturated group-containing monomers may be carried out by a radical polymerization such as bulk polymerization method, solution polymerization method, suspension polymerization, or emulsion polymerization by using a catalyst such as peroxide.

In the present invention, it is important that the acrylic resin has a glass transition point of not higher than −40° C., or not lower than the softening temperature of a flux residue in post-reflow. If the glass transition point of the acrylic acid exceeds −40° C. and below the softening temperature of the flux residue in post-reflow, bonding strength is remarkably lowered under a severe cold-heat cycle load, for example, between a temperature of 90° C. or more and a temperature of −30° C. or less. Here, as described above, the softening temperature of the flux residue in post-reflow may be the softening temperature obtained by measuring the solidified product (residue) generated by heating only the flux, or the softening temperature obtained by measuring the solidified product (residue) generated around the solder by heating the flux being mixed with the solder alloy powder. In the present invention, it is based on the fact that the softening temperature of the flux residue in post-reflow is higher than −40° C.

In the present invention, a glass transition point (Tg) is calculated using the Tg of various kinds of homopolymers by the following calculation equation.

$$1/Tg = \sum_{i=1}^{n} \left(\frac{Wi}{Tgi}\right)$$

where Tg is a Tg (K) of a copolymer; Tgi is a Tg (K) of the homopolymer of a copolymer monomer; and Wi is a percentage by weight of the copolymer monomer.

Although no special limitation is imposed on the acid value of the acrylic resin, it is preferably, for example, 10 mg KOH/g or more in order to further promote activation action.

However, for example, if only esters are used as the polymerizable unsaturated group-containing monomer, the acid value of the acrylic resin may be 0 mg KOH/g.

Preferably, the acrylic resin has a molecular weight of 30000 or less, more preferably 20000 or less. When the molecular weight of the acrylic resin falls within the foregoing range, even if the resin is polymerized to a certain degree by heating during reflow, the influence thereof such as characteristic deterioration can be reduced. It is therefore capable of preventing cracking of the solder section as well as cracking occurred in the flux residue in the environment having a large temperature difference. As a result, it becomes possible to avoid the problem that moisture enters into the cracked portions and causes short circuit defects between component leads.

In the present invention, the molecular weight of the acrylic resin means weight average molecular weight.

The acrylic resin content is preferably 10 to 80% by weight, more preferably 20 to 70% by weight to the total amount of the flux. If the acrylic resin is less than the foregoing range, it becomes difficult to uniformly apply an activating agent to metal during soldering, and hence, there is the risk of soldering defects. There is also the risk that film properties after soldering is deteriorated and high temperature durability is deteriorated. On the other hand, if the acrylic resin is more than the foregoing range, there is the risk that the viscosity of the flux itself is increased and solderability is deteriorated due to the increased thickness of the flux.

The flux of the present invention contains the activating agent as an essential ingredient. The activating agent removes an oxide film on the metal surface during soldering, thereby ensuring excellent solderability.

Examples of the activating agent include hydrohalides of ethylene amine, propylamine, diethylamine, triethylamine, ethylenediamine, and aniline; and organic carboxylic acids such as lactic acid, citric acid, stearic acid, adipic acid, and diphenylacetic acid. Only one or more of these activating agents may be used.

The activating agent content is preferably 0.1 to 30% by weight, more preferably 1 to 20% by weight to the total amount of the flux. If the activating agent content is less than the foregoing range, there is the risk that solderability is deteriorated for lack of activating force. On the other hand, if the activating agent content is more than the foregoing range, there is the risk that the film properties of the flux is lowered and the hydrophilicity thereof is increased, thus deteriorating corrosion resistance and insulation properties.

The flux of the present invention contains a thixotropic agent having a hydroxyl group as an essential ingredient. For example, if the flux contains a thixotropic agent having no hydroxyl group and does not contain a thixotropic agent having a hydroxyl group, the maximum linear thermal expansion coefficient is beyond the foregoing range, so that the bonding strength after being subjected to the severe cold-heat cycle load is remarkably lowered.

Examples of the thixotropic agent having a hydroxyl group include cured castor oil, methylol behen acid amide, 12-hydroxystearic acid ethylene bisamide, erucic acid monoethanolamide, 12-hydroxystearic hexamethylene bisamide, and oxidized paraffin wax. Only one or more of these thixotropic agents having a hydroxyl group may be used.

The content of the thixotropic agent having a hydroxyl group is preferably 0.5 to 10% by weight, more preferably 2 to 8% by weight in the total amount of the flux. If the thixotropic agent having a hydroxyl group is less than the foregoing range, there may be the risk that sufficient thixotropy cannot be obtained, and the ease of operation such as printability may be deteriorated. On the other hand, if the thixotropic agent having a hydroxyl group is more than the foregoing range, there may be the risk that the viscosity of the flux is increased and the ease of operation is impaired.

Examples of the thixotropic agent having no hydroxyl group include paraffin wax, polyethylene wax, polypropylene wax, stearic acid amide, oleic acid amide, erucic acid amide, ethylene-bis-lauric acid amide, buthylene-bis stearic acid amide, xylene-bis-stearic acid amide, N,N'-distearyl adipic acid amide, N,N'-dioleyl-sebacic acid amide, N,N'-distearyl isophthalic acid amide, and xylene bisstearyl urea. Although these thixotropic agents having no hydroxyl group are not essential ingredients of the present invention, they may be contained unless they impair the effect of the present invention.

The flux of the present invention preferably also contains an antioxidant. The oxidization of the flux residue due to the heating during reflow can be prevented by also containing the antioxidant. It is therefore capable of preventing cracking of the solder section as well as cracking occurred in the flux residue in the environment having a large temperature difference. As a result, it becomes possible to avoid the problem that moisture enters into the cracked portions and causes short circuit defects between the component leads.

No special limitation is imposed on the antioxidant. Examples of the antioxidant are well known phenol-based, phosphorous-based, amine-based, sulfur-based antioxidants. Only one or more of these antioxidants may be used.

Examples of the phenol-based antioxidants include 2,6-di-t-butyl-4-[4,6-bis(octylthio)-1,3,5-triazine-2-ilamino]phenol, 2,6-di-t-butyl-p-cresol, 2,4-dimethyl-6-t-butyl-phenol, styrenate phenol, and 2,4-bis[(octylthio)methyl]-o-cresol. Examples of the phosphorous-based antioxidants include triphenyl phosphite, triethyl phosphite, trilauryltrithio phosphite, and tris(tridecyl) phosphite. Examples of the amine-based antioxidants include α-naphthylamine, triethylamine, N,N'-diisobutyl-p-phenylenediamine, and phenyl-β-naphrylamine. Examples of the sulfur-based antioxidants include dilauryl thiodipropionate, dilauryl sulfide, 2-mercaptobenzoimidazol, and lauryl stearyl thiodipropionate.

Although there is no special limitation to the antioxidant content, for example, it is preferably 0.05 to 10% by weight, more preferably 0.1 to 5% by weight in the total amount of the flux.

The flux of the present invention preferably further contains a rosin-based resin. The rosin-based resin thus contained acts as binder for allowing the activating agent to uniformly adhere to the metal, thereby achieving more efficient removal of the oxide film on the metal surface.

The rosin-based resin may be one of those conventionally generally used for flux, without any special limitation. For example, there are usual gum rosin, tall oil rosin, and wood rosin, as well as their derivatives (for example, disproportionated rosin, heat-treated resin, polymerized rosin, acrylated rosin, hydrogenated rosin, formylated rosin, rosin ester, rosin modified maleic acid resin, rosin modified phenol resin, and rosin modified alkyd resin). Only one or more of these rosin-based resins may be used.

When a rosin-based resin is contained as a new resin ingredient other than the acrylic resin to the flux, the content of the rosin-based resin is desirably set so that the average glass transition point of a mixture of the acrylic resin and the rosin-based resin, which is calculated from their respective glass transition points and their respective contents, falls within the foregoing range of the glass transition point of the acrylic resin. The content of the rosin-based resin may be usually preferably 1 to 20% by weight, more preferably 5 to 10% by weight in the total amount of the flux.

The flux of the present invention may further contain an organic solvent as needed. The organic solvent is preferably a polar solvent that dissolves the foregoing contained ingredients into solution. Usually, alcohol base solvents such as ethyl alcohol, isopropyl alcohol, ethyl cellosolve, butyl carbitol, and hexyl carbitol are suitably used. Alternatively, ester base solvents such as ethyl acetate and butyl acetate; or hydrocarbon base solvents such as toluene and turpentine oil can also be used as an organic solvent. Among others, hexyl carbitol is preferred from the viewpoints of volatility and the solubility of the activating agent. Only one or more of these organic solvents may be used.

The organic solvent content is preferably, for example, 15 to 70% by weight to the total amount of the flux, without any special limitation thereto. If the organic solvent is less than the foregoing range, there may be the risk that the viscosity of the flux is increased and the coating properties of the flux are deteriorated. On the other hand, if the organic solvent is more than the foregoing range, there may be the risk that the effective ingredients (the foregoing essential ingredients) as the flux are relatively reduced, and hence solderability is deteriorated.

In addition to the foregoing respective ingredients, the flux of the present invention can also contain, in such a range as not to impair the effect of the present invention, a well known synthetic resin generally used as a base resin of flux (such as styrene-maleic acid resin, epoxy resin, urethane resin, polyester resin, phenoxy resin, or terpene resin), and additives such as anti-mold agent and flatting agent.

The solder paste composition of the present invention contains a solder alloy powder and the foregoing soldering flux of the present invention.

There is no special limitation to the solder alloy powder. For example, tin-lead alloy of general use, or tin-lead alloy further containing silver, bismuth, or indium may be used. Alternatively, lead-free alloys such as tin-silver based, tin-copper based, tin-silver-copper based or tin-bismuth based ones may be used. The particle size of the solder alloy powder may be preferably approximately 5 to 50 μm.

The weight ratio of the flux and the solder alloy powder in the solder paste composition of the present invention (flux to solder alloy powder) may be suitably set depending on the desired solder paste use and function, and it is preferably approximately 5:95 to 20:80, without special limitations.

The solder paste composition of the present invention is used for soldering by allowing it to reflow. For example, after preheating at approximately 130° C. to 200° C., the reflow may be carried out at the highest temperature of approximately 170° C. to 250° C., without limitation. In the soldering, the solder paste composition is usually applied onto a substrate by a dispenser, screen printing, or the like.

Next, an embodiment of the bonding structure of the present invention is described with reference to the drawing.

FIG. 1 is an enlarged sectional view partially showing an embodiment of the solder structure of the present invention. In the solder bonding structure, an electronic component 4 is mounted on a substrate 1 (that is, on a main surface 1a) including an electrode section 2 and an insulating film 3 on the main surface 1a, and the electrode section 2 and the electronic component 4 are electrically bonded to each other through a solder section 5. A flux residue 6 exuded from the solder section 5 is present between the electronic component 4 and the insulating film 3 in the solder bonding structure.

In the solder bonding structure of the present invention, the solder section 5 is formed by allowing a solder paste composition being a mixture of a solder alloy powder and flux to reflow. Here, the used flux is the flux of the present invention containing an acrylic resin, an activating agent, and a thixotropic agent having a hydroxyl group, in which the glass transition point of the acrylic resin is not higher than −40° C., or not lower than the softening temperature of the flux residue. The maximum linear thermal expansion coefficient of the flux residue 6 (namely, the maximum value of the linear thermal expansion coefficient within the temperature range from −40° C. to the softening temperature of the flux residue) is not more than $300 \times 10^{-6}$/K. Consequently, even if a severe cold-heat cycle is loaded, bonding strength deterioration can be reduced, thereby ensuring high bonding reliability even when used in the environment having a large temperature difference.

Thus, the solder section 5 in the solder bonding structure as shown in FIG. 1 is formed by using the solder alloy powder and the flux of the present invention. This is useful as a method of preventing deterioration in solder bonding strength under temperature load conditions where the cold-heat cycle is repeated between a temperature of 90° C. or more and a temperature of −30° C. or less (specifically, −40° C. to 125° C.). That is, according to the method of preventing solder bonding strength deterioration of the present invention, it can be prevented from lowering the bonding strength of the solder section under temperature load conditions where the cold-heat cycle is repeated between a temperature of 90° C. or more and a temperature of −30° C. or less, and the solder section is formed by using the solder alloy powder and the soldering flux of the present invention.

The "flux residue" in the solder bonding structure of the present invention may refer to the description of the "flux residue in post-reflow" as set forth in the description of the flux of the present invention. The "softening temperature of the flux residue" in the solder bonding structure of the present invention may refer to the description of the "softening temperature of the flux residue in post-reflow" as set forth in the description of the flux of the present invention.

PRACTICAL EXAMPLES

The present invention is described below in further details based on Examples and Comparative Examples. The present invention is, however, not limited to the following examples.

The average molecular weights of acrylic resins shown in the following respective preparation examples and tables denote weight average molecular weights.

Various measurements and evaluations in these examples and comparative examples were made by the following methods.

<Maximum Linear Thermal Expansion Coefficient of Flux Residue and Softening Temperature of Flux Residue>

Approximately 0.5 g of a solder paste composition was placed on a copper plate (50mm×50mm×0.5mm), and the solder was melted by heating it on a hot plate that was set to 250° C. for 30 seconds. Thereafter, this was cooled to ordinary temperature, and the generated flux residue was recovered by scraping. This operation was carried out five times. All of the recovered residues were uniformly melted, mixed and then formed into a shape of 3 mm wide, 3 mm thick and 10 mm long, which was used as a sample.

Subsequently, the expansion and shrinkage of the sample thus formed were measured by using a thermal mechanical analyzer ("TMA/SS120" manufactured by Seiko Instruments Inc.), and its linear thermal expansion coefficient was found. In the measurements, each sample was heated from −40° C. at a heating rate of 5° C. per minute in an argon gas atmosphere.

As the sample heating proceeded, the sample softening was started and a rapid shrinkage in the apparent length of the sample occurred at the same time, and the sample length finally became zero. Therefore, the temperature from which the rapid shrinkage of the sample apparent length occurred was regarded as the softening temperature of the flux residue. Thereafter, the heating was continued until the temperature was increased by 30° C. from the softening temperature, and the linear thermal expansion coefficient was found. The maximum value among the linear thermal expansion coefficient from −40° C. to the softening temperature thus found was employed as the maximum linear thermal expansion coefficient. It was confirmed that the sample was completely melted, and the sample length became substantially zero while heating so that the temperature was increased by 30° C. from the softening temperature.

<Bonding Strength Test>

A solder paste composition was printed on two glass epoxy substrates each including an insulating film having a pattern for mounting 120 chip components (electronic components) whose size was 3.2 mm×1.6 mm, and electrodes bonding these chip components, by using a 150 μm thick metal mask having the same pattern, and the 120 chip components were mounted thereon. Within 10 minutes after mounting these chip components, soldering was carried out by performing preheating at 160±5° C. for 80±5 seconds in a nitrogen atmosphere of 1500 ppm oxygen concentration, followed by reflowing at a maximum temperature of 240±5° C.

In the solder bonding structure thus obtained, the electrodes and the chip components were electrically bonded to each other through a solder section, and flux residue existed between the chip components and the insulating film on the surface of the glass epoxy substrate.

Next, one of the two substrates after soldering was subjected to a cold-heat cycle load under the condition of 1000 cycles, each cycle ranging from −40° C. for 30 minutes to 125° C. for 30 minutes. Thereafter, the bonding strength (shear strength) of the 120 chip components on each of the substrate subjected to the cold-heat cycle load and the substrate not subjected to the cold-heat cycle load was measured according to JIS Z-3198-7 by using a pressure shear testing machine. In the shear strength measurements, a shear instrument having a 0.5-mm-diameter indenter was used, and the substrate was set on the testing machine so that the shear instrument was located vertically with respect to the chip component and at the mid portion of the chip component. Then, load was applied thereto while moving the shear instrument at a speed of 15 mm/min.

The ratio of the shear strength of the substrate subjected to the cold-heat cycle load to the shear strength of the substrate not subjected to the cold-heat cycle load was expressed in percentage, and the value thereof was obtained as a remaining strength percentage (%). Based on the remaining strength percentage, the strength deterioration due to solder cracking at the bonding section was evaluated. Specifically, the remaining strength percentages of not less than 70% were regarded as "suitable" from the viewpoint of the substrate bonding reliability.

Preparation Example 1

Monomer ingredients consisting of 34.2 parts by weight of ethyl methacrylate, 24.0 parts by weight of lauryl acrylate, 35.2 parts by weight of benzyl methacrylate, and 6.6 parts by weight of methacrylic acid were polymerized by solution polymerization method, thus obtaining a thermoplastic acrylic resin A.

The thermoplastic acrylic resin A had a glass transition point (Tg) of 51° C., an acid value of 43 mg KOH/g, and an average molecular weight of approximately 6000.

Preparation Example 2

Monomer ingredients consisting of 25.4 parts by weight of t-butyl methacrylate, 53.1 parts by weight of cetyl acrylate, 13.8 parts by weight of cyclohexyl acrylate, and 7.7 parts by weight of methacrylic acid were polymerized by solution polymerization method, thus obtaining a thermoplastic acrylic resin B.

The thermoplastic acrylic resin B had a glass transition point (Tg) of 54° C., an acid value of 50 mg KOH/g, and an average molecular weight of approximately 23500.

Preparation Example 3

Monomer ingredients consisting of 24 parts by weight of lauryl acrylate, 29.7 parts by weight of cetyl acrylate, 25.6 parts by weight of n-butyl acrylate, and 20.7 parts by weight of methacrylic acid were polymerized by solution polymerization method, thus obtaining a thermoplastic acrylic resin C.

The thermoplastic acrylic resin C had a glass transition point (Tg) of 14° C., an acid value of 135 mg KOH/g, and an average molecular weight of approximately 12000.

Preparation Example 4

Monomer ingredients consisting of 63.2 parts by weight of 2-ethylhexyl acrylate, 22.0 parts by weight of n-butyl acrylate, and 14.8 parts by weight of methacrylic acid were polymerized by solution polymerization method, thus obtaining a thermoplastic acrylic resin D.

The thermoplastic acrylic resin D had a glass transition point (Tg) of −62° C., an acid value of 97 mg KOH/g, and an average molecular weight of approximately 27000.

Preparation Example 5

Monomer ingredients consisting of 28.9 parts by weight of lauryl acrylate, 41.9 parts by weight of 2-ethylhexyl acrylate, and 29.2 parts by weight of n-butyl acrylate were polymerized by solution polymerization method, thus obtaining a thermoplastic acrylic resin E.

The thermoplastic acrylic resin E had a glass transition point (Tg) of −71° C., an acid value of 0 mg KOH/g, and an average molecular weight of approximately 9500.

Preparation Example 6

Monomer ingredients consisting of 26.0 parts by weight of isobornyl acrylate, 19.2 parts by weight of cyclohexyl acrylate, 44.0 parts by weight of benzyl methacrylate, and 10.8 parts by weight of methacrylic acid were polymerized by solution polymerization method, thus obtaining a thermoplastic acrylic resin F.

The thermoplastic acrylic resin F had a glass transition point (Tg) of 62° C., an acid value of 70 mg KOH/g, and an average molecular weight of approximately 7500.

Preparation Example 7

Monomer ingredients consisting of 36.3 parts by weight of phenoxyethyl acrylate, 29.1 parts by weight of cyclohexyl acrylate, 30.5 parts by weight of benzyl acrylate, and 4.1 parts by weight of methacrylic acid were polymerized by solution polymerization method, thus obtaining a thermoplastic acrylic resin G.

The thermoplastic acrylic resin G had a glass transition point (Tg) of 1° C., an acid value of 27 mg KOH/g, and an average molecular weight of approximately 17500.

Examples 1 to 4 and Comparative Examples 1 and 2

One or more kinds of the acrylic resins A, B and C, which were obtained in the foregoing preparation examples, and a disproportionated rosin (having a glass transition point (Tg) of 40° C.), as base resins; diphenylacetic acid, adipic acid and aniline hydrobromide as activating agents; 12-hydroxystearic acid ethylene bisamide as a thixotropic agent having a hydroxyl group; "IRGANOX 565" manufactured by Ciba Specialty Chemicals K.K., as a phenol-based antioxidant; and hexyl carbitol as a solvent were mixed in the blend compositions shown in Table 1, and then melted, and dispersed uniformly by sufficiently applying heat, thereby obtaining individual fluxes.

The obtained respective fluxes and a solder alloy powder (having a grain diameter of 38 to 25 μm) composed of Sn—Pb alloy (Sn:Pb=63.0:37.0 (weight ratio)) were mixed at the following ratio: flux to solder alloy powder is 10:90 (weight ratio), thereby obtaining individual solder paste compositions.

A bonding strength test was conducted using the obtained solder paste compositions. The results are shown in Table 1.

cold-heat cycle from −40° C. to 125° C. Example 4 is the example of a combined use of the acrylic resin and the rosin-based resin. The average glass transition point of the mixture of the acrylic resin and the rosin-based resin was calculated to be 52° C., which was a value not less than the softening temperature of the post reflow flux residue.

On the other hand, in Comparative Example 1 using only the rosin-based resin instead of the acrylic resin, the maximum linear thermal expansion coefficient of the residue exceeds $300 \times 10^{-6}$/K, and a remarkable deterioration in the bonding strength after the cold-heat cycle is observed. In Comparative Example 2, the glass transition point of the acrylic resin falls within the range exceeding −40° C. and lower than the softening temperature of the post reflow flux residue, and hence a remarkable deterioration in the bonding strength after the cold-heat cycle is observed.

Examples 5 to 8 and Comparative Examples 3 to 5

One or more kinds of the acrylic resins D, E, F and G, which were obtained in the foregoing preparation examples, and a disproportionated rosin (having a glass transition point (Tg) of 40° C.), as base resins; diphenylacetic acid, adipic acid and monoethylamine hydrochloride as activating agents; either one of methylol behen acid amide (a thixotropic agent having a hydroxyl group) and stearic acid hexamethylene bisamide (a thixotropic agent having no hydroxyl group) as a thixotropic agent; "IRGANOX 565" manufactured by Ciba Specialty Chemicals K.K., as a phenol-based antioxidant;

TABLE 1

|  |  | Example | | | | Comp. Ex. | |
| --- | --- | --- | --- | --- | --- | --- | --- |
|  |  | 1 | 2 | 3 | 4 | 1 | 2 |
| Flux composition (% by weight) | Acrylic Resin A Tg: 51° C. Acid value: 43 mgKOH/g Mol. wt.: approx. 6000 | 65.0 | — | 65.0 | — | — | — |
|  | Acrylic Resin B Tg: 54° C. Acid value: 50 mgKOH/g Mol. wt.: approx. 23500 | — | 65.0 | — | 55.0 | — | — |
|  | Acrylic Resin C Tg: 14° C. Acid value: 135 mgKOH/g Mol. wt.: approx. 12000 | — | — | — | — | — | 65.0 |
|  | Disproportionated rosin Tg: 40° C. | — | — | — | 10.0 | 65.0 | — |
|  | Diphenylacetic acid | 3.0 | 3.0 | 3.0 | 3.0 | 3.0 | 3.0 |
|  | Adipic acid | 1.0 | 1.0 | 1.0 | 1.0 | 1.0 | 1.0 |
|  | Aniline hydrobromide | 0.3 | 0.3 | 0.3 | 0.3 | 0.3 | 0.3 |
|  | 12-hydroxystearic acid ethylene bisamide | 5.0 | 5.0 | 5.0 | 5.0 | 5.0 | 5.0 |
|  | Antioxidant | 0.5 | 0.5 | — | 0.5 | 0.5 | 0.5 |
|  | Hexyl carbitol | 25.2 | 25.2 | 25.7 | 25.2 | 25.2 | 25.2 |
|  | Softening Temperature of flux residue (° C.) | 40 | 43 | 45 | 48 | 51 | 41 |
|  | Maximum linear thermal expansion coefficient of residue ($\times 10^{-6}$/K) | 144 | 153 | 145 | 189 | 522 | 252 |
|  | Remaining strength percentage (%) | 92 | 90 | 85 | 91 | 62 | 58 |

Table 1 shows that Examples 1 to 4 each using an acrylic resin and a thixotropic agent having a hydroxyl group, in which the maximum linear thermal expansion coefficient of the residue is $300 \times 10^{-6}$/K or less and the glass transition point of the acrylic resin is not higher than −40° C., or not lower than the softening temperature of the post reflow residue, retain high bonding strength even after loading the severe and hexyl carbitol as a solvent were mixed in the blend compositions shown in Table 2, and then melt and dispersed uniformly by sufficiently applying heat, thereby obtaining individual fluxes.

Subsequently, each of the obtained fluxes and a lead-free solder alloy powder (having a particle diameter of 38 to 25 μm) composed of Sn—Ag—Cu alloy (Sn:Ag:Cu=96.5:3.0:

0.5 (weight ratio) were mixed together at the following ratio: flux to a solder alloy powder is 12:88 (weight ratio), thereby obtaining individual solder paste compositions.

The bonding strength test was conducted using the obtained solder paste compositions. The results are shown in Table 2.

TABLE 2

|  |  | Example | | | | Comp. Ex. | | |
| --- | --- | --- | --- | --- | --- | --- | --- | --- |
|  |  | 5 | 6 | 7 | 8 | 3 | 4 | 5 |
| Flux composition (% by weight) | Acrylic Resin D Tg: −62° C. Acid value: 97 mgKOH/g Mol. wt.: approx. 27000 | 65.0 | 55.0 | — | — | 65.0 | — | — |
|  | Acrylic Resin E Tg: −71° C. Acid value: 0 mgKOH/g Mol. wt.: approx. 9500 | — | — | 65.0 | 55.0 | — | — | — |
|  | Acrylic Resin F Tg: 62° C. Acid value: 70 mgKOH/g Mol. wt.: approx. 7500 | — | — | — | — | — | 65.0 | — |
|  | Acrylic Resin G Tg: 1° C. Acid value: 27 mgKOH/g Mol. wt.: approx. 17500 | — | — | — | — | — | — | 65.0 |
|  | Disproportionated rosin Tg: 40° C. | — | 10.0 | — | 10.0 | — | — | — |
|  | Diphenylacetic acid | 3.0 | 3.0 | 3.0 | 3.0 | 3.0 | 3.0 | 3.0 |
|  | Adipic acid | 1.0 | 1.0 | 1.0 | 1.0 | 1.0 | 1.0 | 1.0 |
|  | Monoethylamine hydrochloride | 0.3 | 0.3 | 0.3 | 0.3 | 0.3 | 0.3 | 0.3 |
|  | Methylol behen acid amide | 5.0 | 5.0 | 5.0 | 5.0 | — | 5.0 | 5.0 |
|  | Stearic acid hexamethylene bisamide | — | — | — | — | 5.0 | — | — |
|  | Antioxidant | 0.5 | 0.5 | 0.5 | 0.5 | 0.5 | 0.5 | 0.5 |
|  | Hexyl carbitol | 25.2 | 25.2 | 25.2 | 25.2 | 25.2 | 25.2 | 25.2 |
|  | Softening Temperature of flux residue (° C.) | 42 | 47 | 39 | 45 | 43 | 48 | 45 |
|  | Maximum linear thermal expansion coefficient of residue ($\times 10^{-6}$/K) | 162 | 169 | 155 | 182 | 324 | 369 | 468 |
|  | Remaining strength percentage (%) | 93 | 92 | 91 | 90 | 61 | 58 | 52 |

Table 2 shows that Examples 5 to 8 each using an acrylic resin and a thixotropic agent having a hydroxyl group, in which the maximum linear thermal expansion coefficient of the residue is not more than $300 \times 10^{-6}$/K and the glass transition point of the acrylic resin is not higher than −40° C. or not lower than the softening temperature of the post reflow residue, retain high bonding strength even after loading the severe cold-heat cycle from −40° C. to 125° C. Examples 6 and 8 are the examples of a combined use of the acrylic resin and the rosin-based resin. The average glass transition point of the mixture of the acrylic resin and the rosin-based resin in Example 6 was calculated to be −46° C., and that in Example 8 was calculated to be −54° C., each of which was the temperature not higher than −40° C.

On the other hand, in Comparative Example 3 using the same arylic resin as Example 5, and using the thixotropic agent having no hydroxyl group, the linear thermal expansion coefficient of the residue exceeds $300 \times 10^{-6}$/K, and the bonding strength after the cold-heat cycle is remarkably deteriorated. Also in Comparative Example 4, in which the glass transition point of the acrylic resin is higher than the softening temperature of the post reflow residue, but the linear thermal expansion coefficient of the residue exceeds $300 \times 10^{-6}$/K, a remarkable deterioration in the bonding strength after the cold-heat cycle is observed. Also in Comparative Example 5, in which the glass transition point of the acrylic resin falls within the range exceeding −40° C. and lower than the softening temperature of the post reflow flux residue, and the linear thermal expansion coefficient of the residue exceeds $300 \times 10^{-6}$/K, a remarkable deterioration in the bonding strength after the cold-heat cycle is observed.

While the solder bonding structure and the soldering flux according to the present invention have been described in detail, it is to be understood that the scope of the present invention is not restricted to these descriptions, and suitable changes and improvements may be made therein as long as they do not impair the gist of the present invention.

The invention claimed is:

1. A solder bonding structure in which an electronic component is mounted on a main surface of a substrate including an electrode section and an insulating film, and the electrode section and the electronic component are electrically bonded to each other through a solder section, and a flux residue exuded from the solder section is present between the electronic component and the insulating film, wherein the flux contains an acrylic resin, an activating agent, and a thixotropic agent having a hydroxyl group, and the glass transition point of the acrylic resin is not higher than −62° C., or not lower than the softening temperature of the flux residue, and the flux residue has a maximum value of $300 \times 10^{-6}$/K or less in linear thermal expansion coefficient within a temperature range from −40° C. to the softening temperature of the flux residue.

2. The solder bonding structure according to claim 1 wherein the solder section is formed by allowing a solder paste composition being a mixture of a solder alloy powder and the flux to reflow.

3. A soldering flux which is used for soldering by mixing it with a solder alloy powder, followed by reflowing, wherein the soldering flux contains an acrylic resin, an activating agent, and a thixotropic agent having a hydroxyl group, and the glass transition point of the acrylic resin is not higher than −62° C., or not lower than the softening temperature of a flux residue in post-reflow, and the flux residue in post-reflow has a maximum value of $300 \times 10^{-6}$/K or less in linear thermal expansion coefficient within a temperature range from −40° C. to the softening temperature of the flux residue.

4. The soldering flux according to claim 3, wherein an antioxidant is further contained.

5. The soldering flux according to claim 3, wherein the acrylic resin is formed by polymerizing at least one kind of polymerizable unsaturated group-containing monomer selected from the group consisting of acrylic acid, methacrylic acid, esters of acrylic acid, esters of methacrylic acid, crotonic acid, itaconic acid, maleic acid, maleic anhydride, esters of maleic acid, esters of maleic anhydride, acrylonitrile, methacrylonitrile, acrylamide, methacrylamide, vinyl chloride, and vinyl acetate.

6. The soldering flux according to claim 3, wherein the acrylic resin has a molecular weight of 30000 or less.

7. The soldering flux according to claim 3, the acrylic resin content is 10 to 80% by weight with respect to the total amount of flux.

8. The soldering flux according to claim 3, wherein a rosin-based resin is further contained.

9. A solder paste composition containing a solder alloy powder and the soldering flux according to claim 3.

10. A method of preventing deterioration of solder bonding strength of a solder section under temperature load conditions where a cold-heat cycle is repeated between a temperature of 90° C. or more and a temperature of −30° C. or less, wherein the solder section is formed by using a solder alloy powder and the soldering flux according to claim 3.

* * * * *